United States Patent
Kautzsch et al.

(10) Patent No.: US 9,938,133 B2
(45) Date of Patent: Apr. 10, 2018

(54) SYSTEM AND METHOD FOR A COMB-DRIVE MEMS DEVICE

(71) Applicant: Infineon Technologies Dresden GmbH, Dresden (DE)

(72) Inventors: Thoralf Kautzsch, Dresden (DE); Mohsin Nawaz, Unterhaching (DE); Alfons Dehe, Reutlingen (DE); Heiko Froehlich, Radebeul (DE); Alessia Scire, Dresden (DE); Steffen Bieselt, Wehlen (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 15/097,808

(22) Filed: Apr. 13, 2016

(65) Prior Publication Data

US 2017/0297895 A1 Oct. 19, 2017

(51) Int. Cl.
*G01L 9/00* (2006.01)
*B81B 3/00* (2006.01)
*B81C 1/00* (2006.01)

(52) U.S. Cl.
CPC ........ *B81B 3/0021* (2013.01); *B81C 1/00166* (2013.01); *B81B 2201/0257* (2013.01); *B81B 2203/0127* (2013.01); *B81B 2203/0136* (2013.01); *B81C 2201/013* (2013.01)

(58) Field of Classification Search
CPC combination set(s) only.
See application file for complete search history.

(56) References Cited

U.S. PATENT DOCUMENTS

| | | | |
|---|---|---|---|
| 7,235,456 B2 | 6/2007 | Sato et al. | |
| 7,545,945 B2 | 6/2009 | Miles | |
| 8,165,323 B2* | 4/2012 | Zhou | H01G 5/011 257/415 |
| 9,003,886 B2* | 4/2015 | Lin | G01P 15/125 73/504.14 |
| 9,136,328 B2 | 9/2015 | Kautzsch et al. | |
| 2008/0123242 A1* | 5/2008 | Zhou | H01G 5/011 361/290 |
| 2013/0283913 A1* | 10/2013 | Lin | G01P 15/125 73/514.32 |
| 2015/0021722 A1 | 1/2015 | Dehe et al. | |
| 2017/0015546 A1* | 1/2017 | Kautzsch | B81B 3/0078 |

OTHER PUBLICATIONS

Sato, T., et al., "Fabrication of Silicon-on-Nothing Structure by Substrate Engineering Using the Empty-Space-in-Silicon Formation Technique", Japanese Journal of Applied Physics, vol. 43, No. 1, Jan. 13, 2004, pp. 12-18.

* cited by examiner

*Primary Examiner* — Telly Green
(74) *Attorney, Agent, or Firm* — Slater Matsil, LLP

(57) ABSTRACT

According to an embodiment, a method of forming a MEMS transducer includes forming a transducer frame in a layer of monocrystalline silicon, where forming the transducer frame includes forming a support portion adjacent a cavity and forming a first set of comb-fingers extending from the support portion. The method of forming a MEMS transducer further includes forming a spring support from an anchor to the support portion and forming a second set of comb-fingers in the layer of monocrystalline silicon. The second set of comb-fingers is interdigitated with the first set of comb-fingers.

29 Claims, 8 Drawing Sheets

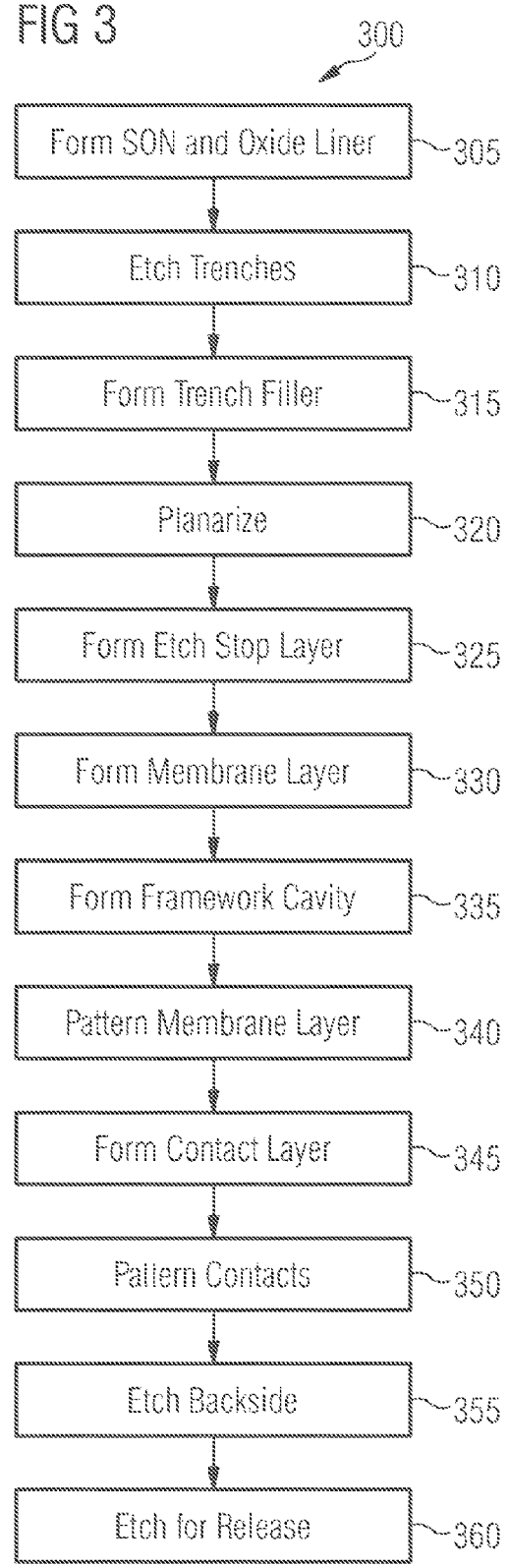

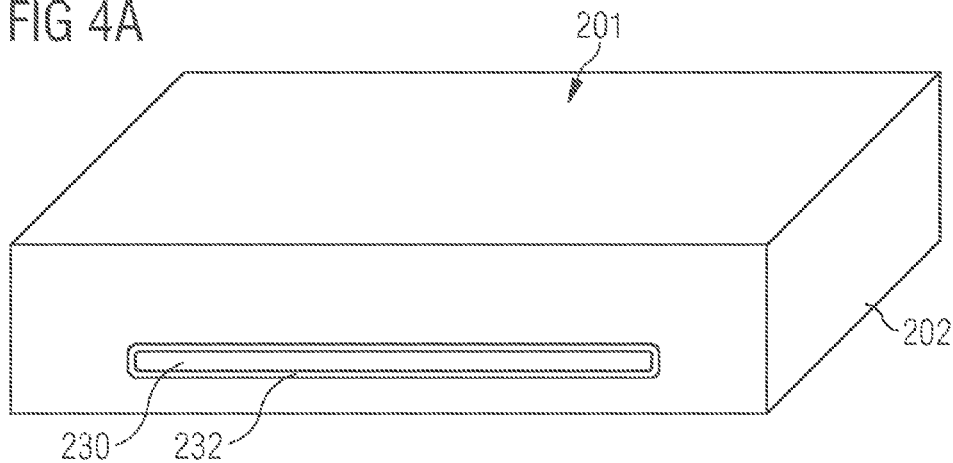
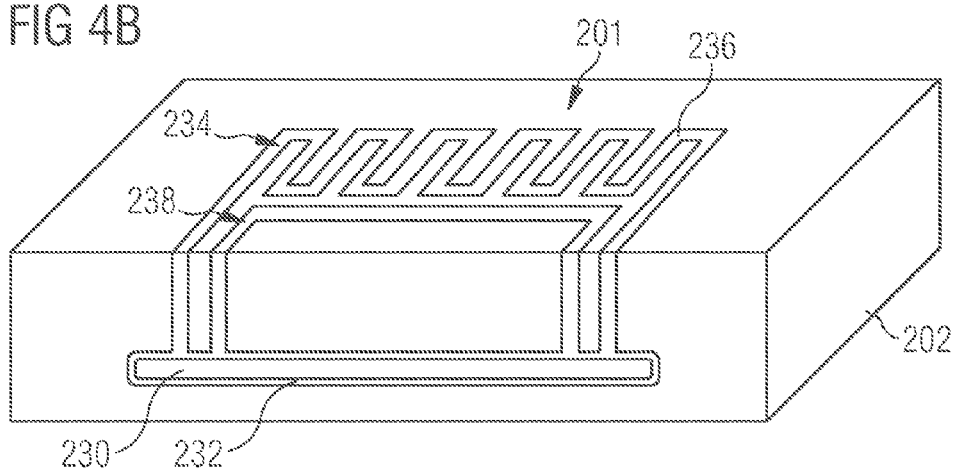
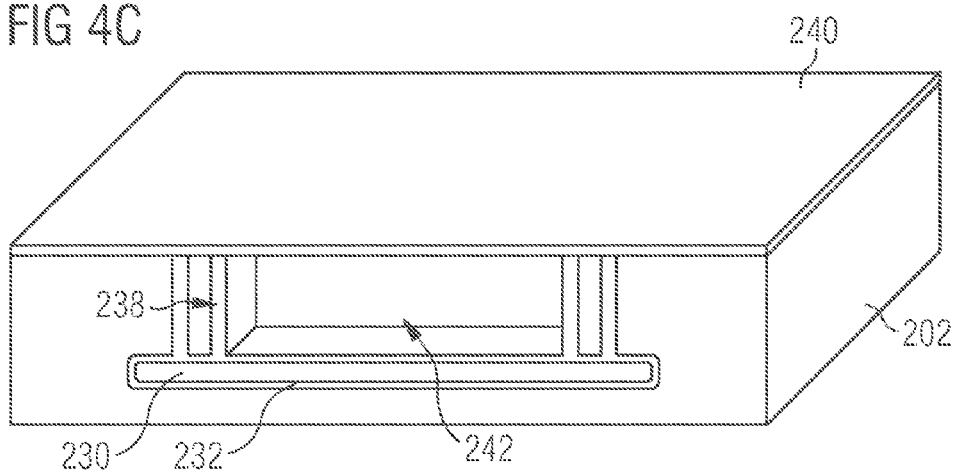

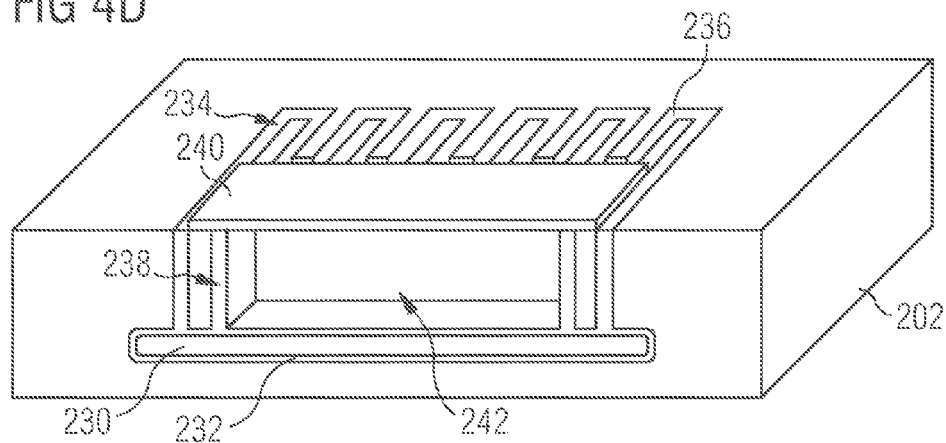
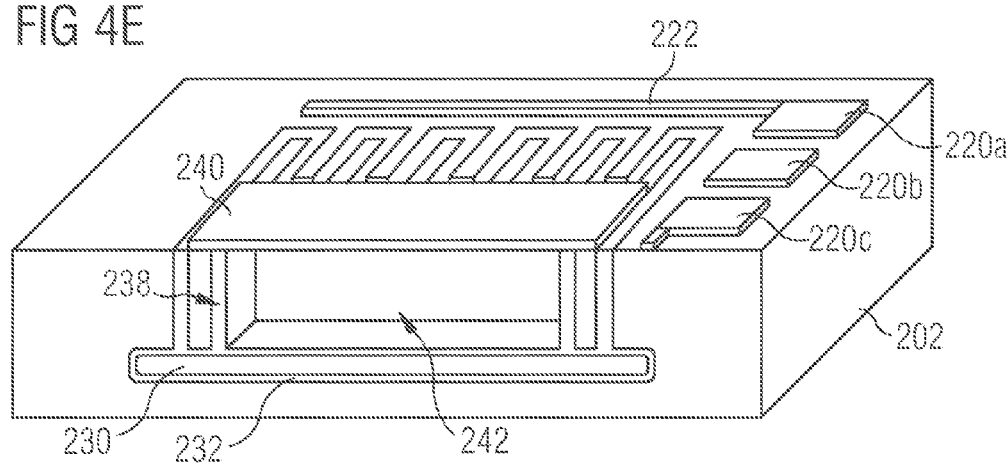
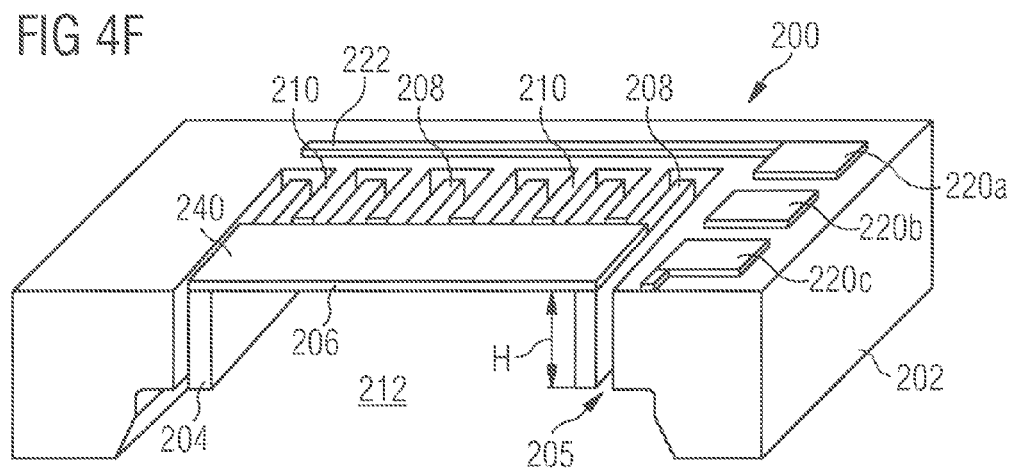

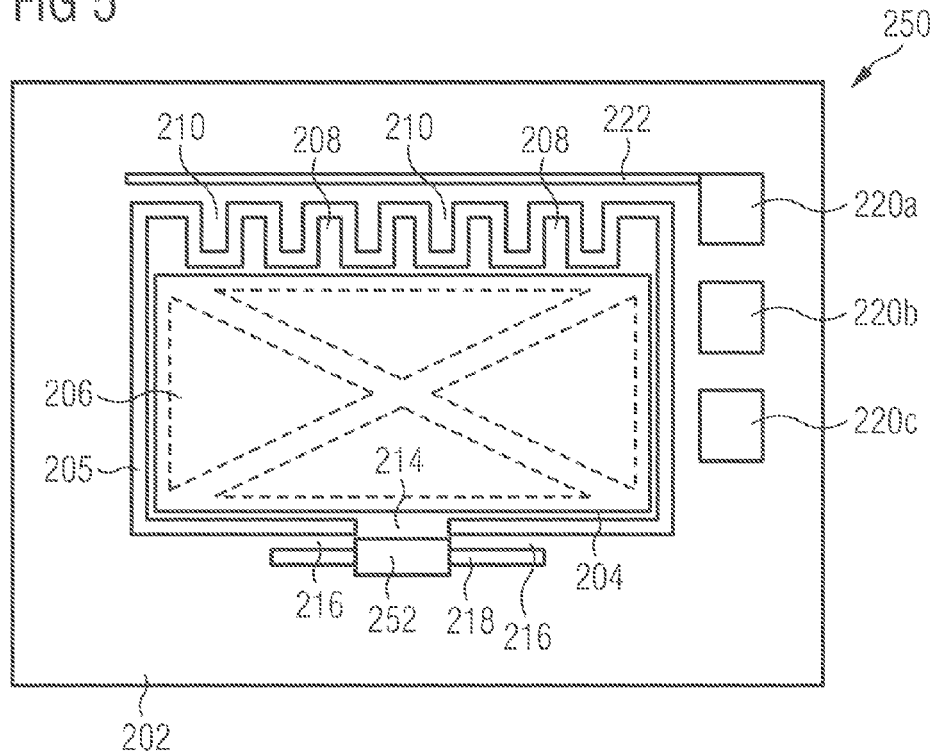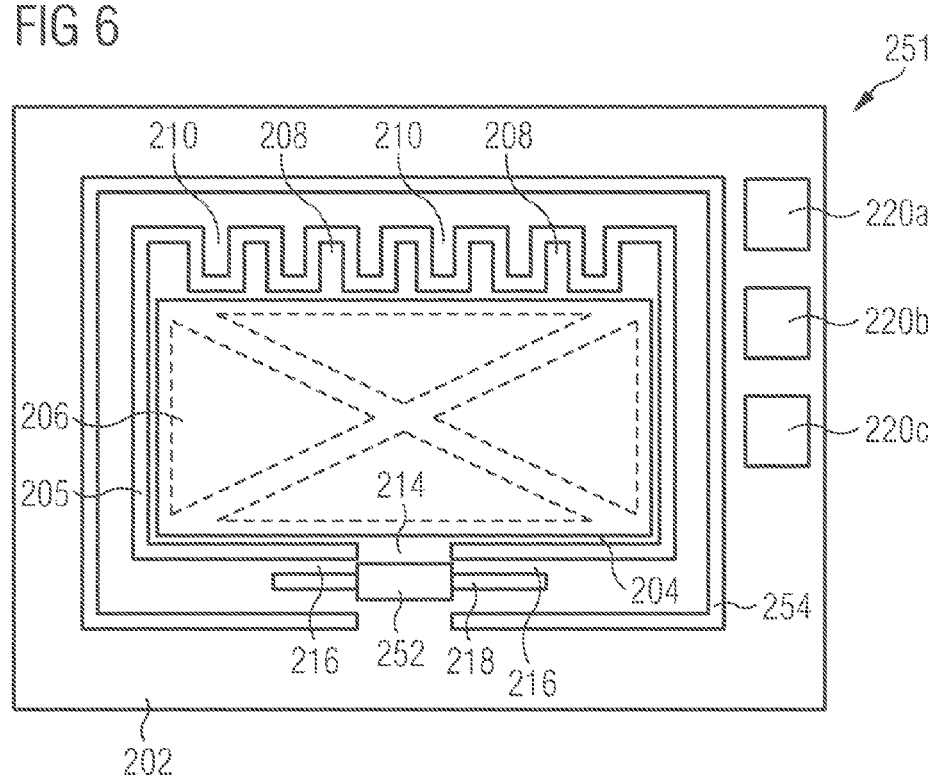

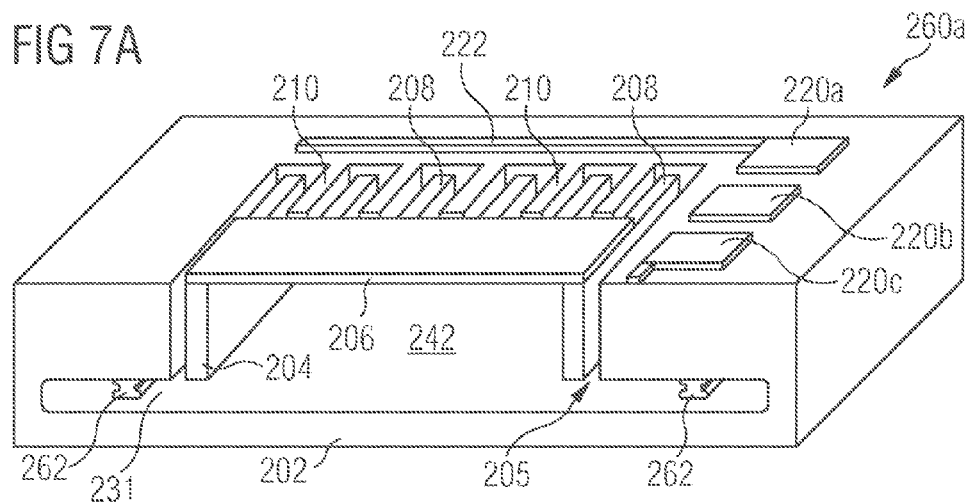
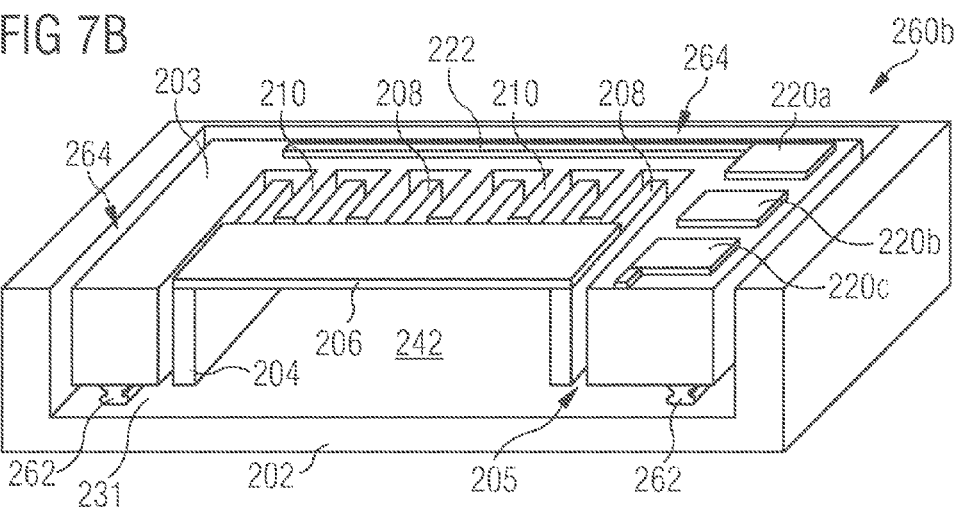
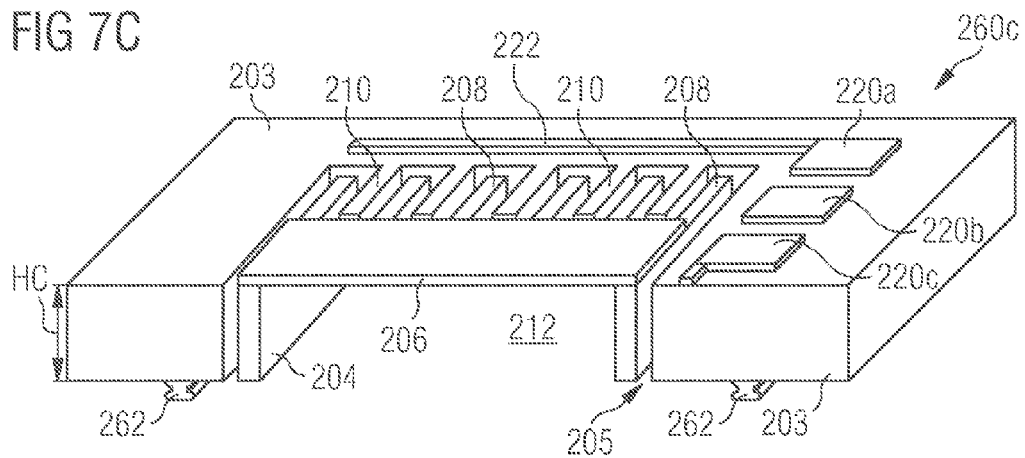

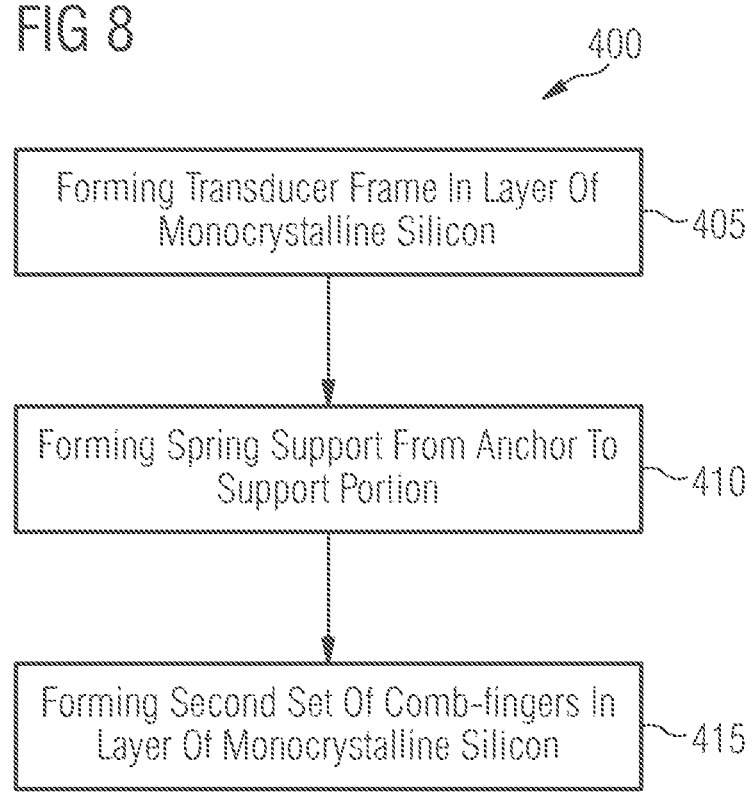

SYSTEM AND METHOD FOR A COMB-DRIVE MEMS DEVICE

TECHNICAL FIELD

The present invention relates generally to fabricated devices, and, in particular embodiments, to a system and method for a comb-drive microelectromechanical systems (MEMS) device.

BACKGROUND

Transducers convert signals from one domain to another and are often used in sensors. One common transducer operating as a sensor that is seen in everyday life is a microphone, which converts, i.e., transduces, sound waves into electrical signals. Another example of a common sensor is a thermometer. Various transducers exist that serve as thermometers by transducing temperature signals into electrical signals.

Microelectromechanical system (MEMS) based transducers include a family of sensors and actuators produced using micromachining techniques. MEMS sensors, such as a MEMS microphone, gather information from the environment by measuring the change of physical state in the transducer and transferring a transduced signal to processing electronics that are connected to the MEMS sensor. MEMS devices may be manufactured using micromachining fabrication techniques similar to those used for integrated circuits.

MEMS devices may be designed to function as, for example, oscillators, resonators, accelerometers, gyroscopes, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits.

One such capacitive sensing device is a MEMS microphone. A MEMS microphone generally has a deflectable membrane separated by a small distance from a rigid backplate. In response to a sound pressure wave incident on the membrane, it deflects towards or away from the backplate, thereby changing the separation distance between the membrane and backplate. Generally, the membrane and backplate are made out of conductive materials and form "plates" of a capacitor. Thus, as the distance separating the membrane and backplate changes in response to the incident sound wave, the capacitance changes between the "plates" and an electrical signal is generated.

MEMS microphones with this type of parallel plate capacitive structure formed from the deflectable membrane and rigid backplate may include various performance characteristics as a consequence of the parallel plate structure. For example, the rigid backplate is often perforated in order to allow air to pass through the backplate so that the rigid backplate is acoustically transparent. However, in practice, the rigid backplate often is not fully acoustically transparent and generates some amount of acoustic noise. This often leads to a tradeoff between mechanical robustness, such as by including fewer and smaller perforations in the rigid backplate, and acoustic noise reduction, such as by including more and larger perforations in the rigid backplate.

Another characteristic of such parallel plate structures is the phenomenon known as "pull-in." In order to operate as an acoustic transducer, a bias voltage is applied between the deflectable membrane and the rigid backplate. Because of the voltage applied between the plates, changes in capacitance between the plates, resulting from motion of the deflectable membrane, produce a measurable voltage signal that corresponds to an incident acoustic signal. However, due to the applied bias voltage, as the separation distance between the deflectable membrane and the rigid backplate decreases, an attractive electrostatic force also increases. The attractive electrostatic force is usually balanced by a restoring mechanical spring force in the deflectable membrane, the attractive electrostatic force increases non-linearly as the distance becomes small while the restoring mechanical spring force increases only linearly. The difference in relation to separation distance results in the attractive electrostatic force overcoming the restoring mechanical spring force when the separation distance reaches a certain limit, which causes pull-in or collapse as the deflectable membrane moves all the way to contact the rigid backplate and may result in stiction. The phenomenon of pull-in presents another tradeoff between resistance to pull-in, from increased rigidity of the deflectable membrane or lower bias voltage, and higher sensitivity, from reduced rigidity of the deflectable membrane or increased bias voltage.

Thus, there exists opportunity for inventive MEMS devices with improved performance characteristics.

SUMMARY

According to an embodiment, a method of forming a MEMS transducer includes forming a transducer frame in a layer of monocrystalline silicon, where forming the transducer frame includes forming a support portion adjacent a cavity and forming a first set of comb-fingers extending from the support portion. The method of forming a MEMS transducer further includes forming a spring support from an anchor to the support portion and forming a second set of comb-fingers in the layer of monocrystalline silicon. The second set of comb-fingers is interdigitated with the first set of comb-fingers.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a flowchart diagram of an embodiment method of fabrication for an embodiment MEMS transducer;

FIGS. 4A, 4B, 4C, 4D, 4E, and 4F illustrate cross-sectional perspective views of steps in an embodiment method of fabrication;

FIG. 5 illustrates a top view of a further embodiment MEMS transducer;

FIG. 6 illustrates a top view of an additional embodiment MEMS transducer;

FIGS. 7A, 7B, and 7C illustrate cross-sectional perspective views of steps in an additional embodiment method of fabrication; and FIG. 8 illustrates a flowchart diagram of a further embodiment method of fabrication for an embodiment MEMS transducer.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include MEMS transducer systems, MEMS microphone systems, capacitive MEMS transducers, capacitive comb-drive MEMS transducers, MEMS fabrication methods, and silicon-on-nothing (SON) fabrication methods. In other embodiments, aspects may also be applied to other applications involving any type of sensor or transducer and corresponding methods of fabrication according to any fashion as known in the art.

MEMS comb-drives include interdigitated comb-fingers with a first portion of the comb-fingers fixed to an anchor, and thus referred to as a stator, and a second portion of the comb-fingers attached to a deflectable structure, and thus referred to as a rotor. MEMS including a comb-drive many have various advantages. For example, as compared to a parallel plate capacitive MEMS microphone, embodiment comb-drive based capacitive MEMS microphones may have a reduced acoustic noise floor because of the absence of a perforated backplate electrode.

According to various embodiments, a MEMS microphone includes a comb-drive structure coupled to a deflectable membrane. The comb-drive structure may include high aspect-ratio comb-fingers with small separation distance between each comb-finger. Specifically, embodiment comb-drive structure may include conductive material for both rotor comb-fingers and stator comb-fingers formed as a same conductive layer and patterned during a same patterning process. In particular embodiments described herein, MEMS microphones including a comb-drive structure are formed using a silicon-on-nothing (SON) process that produces both rotor comb-fingers and stator comb-fingers from a single layer of single crystal silicon. In such embodiments, high aspect ratio comb-fingers may be produced with small separation distance between each comb-finger.

Figure 1A:
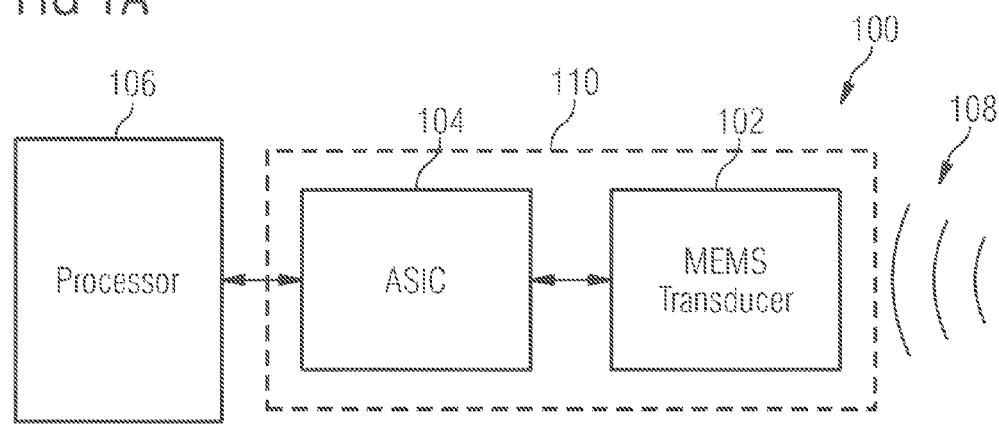
FIGS. 1A and 1B illustrate a system block diagram and a cross-sectional perspective view of an embodiment MEMS transducer.
Figure 1B:
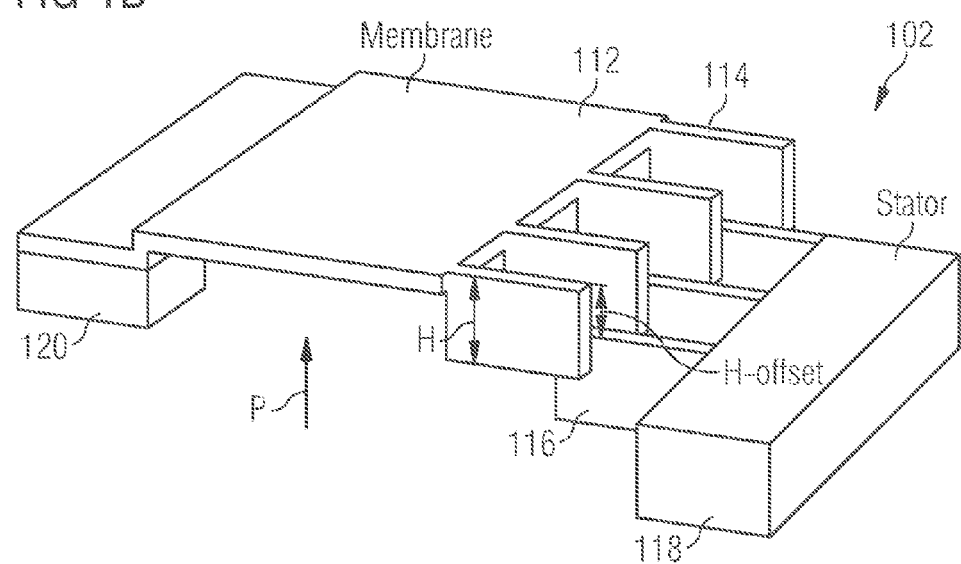

FIGS. 1A and 1B illustrate a system block diagram and a cross-sectional perspective view of an embodiment MEMS transducer. FIG. 1A shows transducer system 100 including MEMS transducer 102, application specific integrated circuit (ASIC) 104, and processor 106. According to various embodiments, MEMS transducer 102 receives physical signal 108, generates a transduced signal, and provides the transduced signal to ASIC 104. In specific embodiments, physical signal 108 is a pressure signal, such as an acoustic pressure wave, and MEMS transducer 102 is a MEMS microphone. In such embodiments, MEMS transducer 102, as a MEMS microphone, converts physical signal 108, e.g., a pressure signal, into an analog electrical signal that is supplied to ASIC 104. Embodiment MEMS transducers and MEMS fabrication sequences are described hereinafter.

In various embodiments, based on the analog electrical signal from MEMS transducer 102, ASIC 104 generates an output signal and provides it to processor 106. ASIC 104 may perform various functions. In some embodiments, ASIC 104 provides a bias signal to MEMS transducer 102. ASIC 104 may implement a constant charge or a constant voltage readout circuit for MEMS transducer 102. In further embodiments, ASIC 104 may include a buffer circuit or an amplifier circuit. In some embodiments, ASIC 104 includes an analog-to-digital converter (ADC). In such embodiments, ASIC 104 provides a digital signal that corresponds to physical signal 108 to processor 106. Further, ASIC 104 may also include an I/O interface circuit for communicating through a communication interface to processor 106.

According to various embodiments, transducer unit 110 includes ASIC 104 and MEMS transducer 102. In such embodiments, transducer unit 110 may be a packaged device, such as a packaged microphone, including a package opening, such as a sound port, for receiving physical signal 108. Transducer unit 110 may include a shared circuit board with separate semiconductor dies for ASIC 104 and MEMS transducer 102 attached to the shared circuit board. In other embodiments, ASIC 104 and MEMS transducer 102 may be assembled in a chip stack as a system-on-chip (SoC), such as through flip-chip bonding. In still other embodiments, ASIC 104 and MEMS transducer 102 may be integrated on a single semiconductor die, i.e., monolithically integrated, as an SoC.

In various embodiments, processor 106 receives an analog or digital electrical signal from ASIC 104. Processor 106 may be a dedicated audio processor, such as an audio coder/decoder (CODEC). In other embodiments, processor 106 may be a general purpose processor. In such various embodiments, processor 106 may be a microprocessor, a digital signal processor (DSP), or a field programmable gate array (FPGA). In alternative embodiments, processor 106 is formed of discrete logic components.

According to various embodiments, ASIC 104 may provide a single signal, such as a single-ended signal, or a differential single to processor 106 that is representative of physical signal 108. In other embodiments, ASIC 104 may provide signals to processor 106 using various communication protocols including data or clock lines. Further, in various embodiments, MEMS transducer 102 may provide a single signal, such as a single-ended signal, or a differential single to ASIC 104 that is representative of physical signal 108.

FIG. 1B shows MEMS transducer 102 including membrane 112, rotor comb-fingers 114, stator comb-fingers 116, and stator 118. According to various embodiments, MEMS transducer 102 is a comb-drive transducer including rotor comb-fingers 114 and stator comb-fingers 116. In particular embodiments, as described herein, MEMS transducer 102 is a pressure transducer, such as an acoustic pressure wave transducer, e.g., for use as a microphone. In other alternative embodiments, MEMS transducer 102 may be another type of transducer using a comb-drive mechanism, such as an accelerometer for example.

In various embodiments, membrane 112 divides a first volume above membrane 112 from a second volume below membrane 112. As shown, pressure P is incident on membrane 112. Pressure P may be an acoustic pressure wave. In the embodiment illustrated, pressure P is incident from below membrane 112, which corresponds to a sound port or opening in a package arranged to provide fluid communication with the bottom of membrane 112 (the second volume). In other embodiments (not shown), pressure P may be incident from above membrane 112, which corresponds to a sound port or opening in a package arranged to provide fluid communication with the top of membrane 112 (the first volume). As pressure P varies, membrane 112 deflects or oscillates. The deflection or oscillation of membrane 112 produces a change in capacitance between rotor comb-fingers 114 and stator comb-fingers 116 because of the corresponding change in overlap area. Thus, an electrical signal may be generated that corresponds to variations in pressure P. For example, when pressure P represents a sound wave, an electrical signal may be produced between rotor comb-fingers 114 and stator comb-fingers 116 that represents the sound signal. In such embodiments, rotor comb-fingers 114 and stator comb-fingers 116 may be biased with a bias voltage and coupled to a read out circuit as described hereinabove in reference to ASIC 104 in FIG. 1A.

In various embodiments, rotor comb-fingers 114 are attached to membrane 112, which is attached to anchor 120. Further, stator comb-fingers 116 are attached to stator 118, which may also be referred to as an anchor. Anchor 120 and stator 118 may be fixed to a substrate or other rigid support structure in order to present movement while membrane 112 formed in order to be thin and deflectable. According to various embodiments, rotor comb-fingers 114 and stator comb-fingers 116 are formed of a same conductive or semiconductive layer as is describe further hereinafter. Rotor comb-fingers 114 and stator comb-fingers 116 are formed with height H, width W, length L, and spacing d. Further, rotor comb-fingers 114 and stator comb-fingers 116 may be configured to include an offset H-Offset. In such embodiments, by including an offset between rotor comb-fingers 114 and stator comb-fingers 116, the electrical signal produced by deflections of oscillations of membrane 112 may be linear, or more linear, compared to embodiments without an offset between rotor comb-fingers 114 and stator comb-fingers 116. In alternative embodiments, no offset is included between rotor comb-fingers 114 and stator comb-fingers 116. Various dimensions, materials, and structures are described further hereinafter in reference to various embodiments.

Figure 2A:
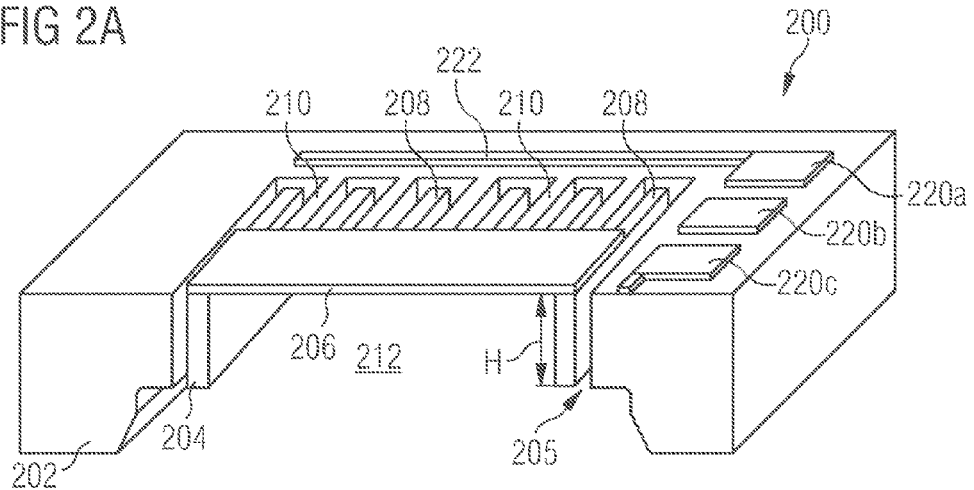
FIGS. 2A and 2B illustrate a cross-sectional perspective view and a top view of another embodiment MEMS transducer.
Figure 2B:
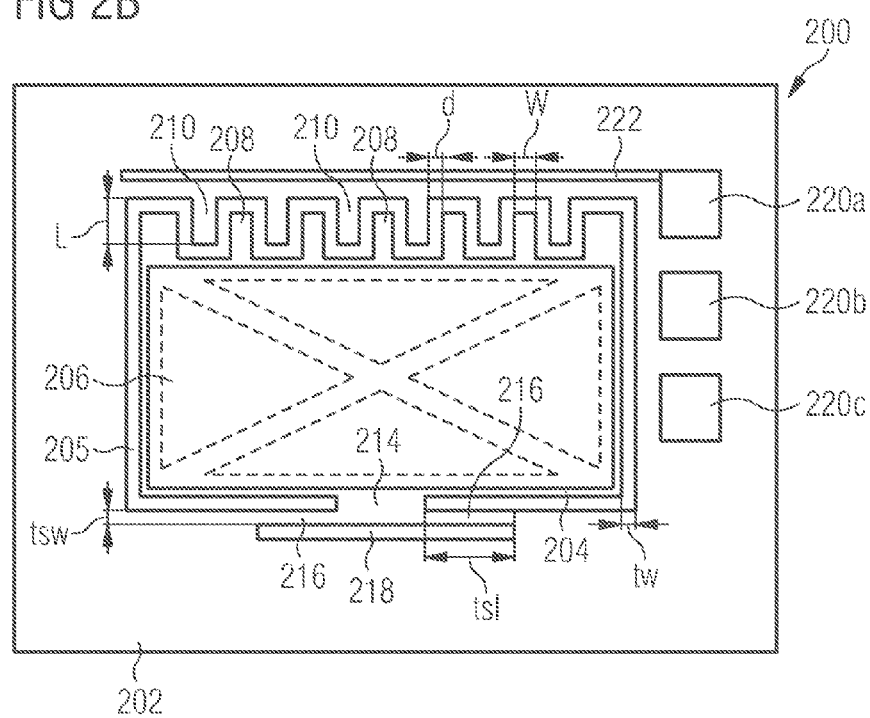

FIGS. 2A and 2B illustrate a cross-sectional perspective view and a top view of another embodiment MEMS transducer 200 including substrate 202, framework 204, membrane 206, rotor comb-fingers 208, and stator comb-fingers 210. According to various embodiments, MEMS transducer 200 is an implementation of MEMS transducer 102 as described hereinabove in reference to FIGS. 1A and 1B. In various embodiments, rotor comb-fingers 208 and stator comb-fingers 210 are formed with a high aspect ratio and include inter-finger spacing distance d, which is small. In such embodiments, rotor comb-fingers 208 and stator comb-fingers 210 may be formed of a single semiconductive or conductive material layer using a silicon-on-nothing (SON) process, or the like, as described further hereinafter in reference to the other figures.

In some embodiments, cavity 212 is formed in substrate 202, and membrane 206 separates cavity 212 from a volume above membrane 206. Framework 204 supports membrane 206 and is attached to rotor comb-fingers 208, which are interdigitated with stator comb-fingers 210. In some embodiments, stator comb-fingers 210 are attached to substrate 202 in order to form a stator structure.

According to various embodiments, framework 204 is coupled to torsional supports 216 through support fixture 214. In such embodiments, torsional supports 216 are configured to twist as membrane 206 and framework 204 deflect and act as a torsional spring with a restoring force and a spring constant. The spring constant and restoring force are based on torsional support length tsl and torsional support width tsw. Torsion trench 218 is positioned next to torsional supports 216 and, together with trench 205, defines torsional support length tsl and torsional support width tsw. In other embodiments, framework 204 and membrane 206 may be coupled to a cantilever type support structure to form a flap membrane. In alternative embodiments, framework 204 and membrane 206 me be coupled to other support structures, such as multiple spring supports including any spring structure as known to those of skill in the art.

In various embodiments, contact pads 220a, 220b, and 220c are formed of a conductive material for providing electrical contact with rotor comb-fingers 208 and stator comb-fingers 210. For example, contact line 222 may electrically couple contact pad 220a to each of stator comb-fingers 210. Contact pads 220b and 220c may be electrically coupled to substrate 202 or rotor comb-fingers 208. In other embodiments, contact pad 220b or contact pad 220c may be coupled to framework 204.

According to various embodiments, framework 204, rotor comb-fingers 208, and stator comb-fingers 210 may be formed of a same semiconductor layer using an SON process, or the like. In specific embodiments, each of substrate 202, framework 204, rotor comb-fingers 208, and stator comb-fingers 210 are monocrystalline, i.e., single-crystal, silicon. In such embodiments, framework 204, rotor comb-fingers 208, and stator comb-fingers 210 may be formed in the SON layer. For example, framework 204, rotor comb-fingers 208, and stator comb-fingers 210 may be formed simultaneously using a single mask for patterning. In various embodiments, membrane 206 may be formed of any appropriate material for forming a thin membrane, such as polysilicon or nitride for example.

In various embodiments, framework 204, rotor comb-fingers 208, and stator comb-fingers 210 are formed of a same semiconductor layer having a layer thickness given by height H. Further, torsional supports 216 and support fixture 214 may have a same layer thickness given by height H. Rotor comb-fingers 208 and stator comb-fingers 210 have width W, length L, inter-finger spacing distance d. In various embodiments, width W ranges from 10 nm to 5 µm. In particular embodiments, width W ranges from 10 nm to 1 µm. In various embodiments, length L ranges from 0.5 µm to 50 µm. In particular embodiments, length L ranges from 2 µm to 20 µm. In various embodiments, height H ranges from 1 µm to 500 µm. In particular embodiments, height H ranges from 2 µm to 30 µm. In various embodiments, inter-finger spacing distance d ranges from 10 nm to 1 µm. In particular embodiments, inter-finger spacing distance d ranges from 50 nm to 500 nm. In more particular embodiments, inter-finger spacing distance d ranges from 100 nm to 300 nm. In alternative embodiments, height H, width W, length L, inter-finger spacing distance d may be outside the specified ranges.

According to various embodiments, by forming rotor comb-fingers 208 and stator comb-fingers 210 in an SON layer, or the like, a very high aspect ratio may be implemented in relation to inter-finger spacing distance d and height H. In some embodiments, the aspect ratio of inter-finger spacing distance d to height H ranges from 1:10 to 1:100. In particular embodiments, the aspect ratio of inter-finger spacing distance d to height H is greater than 1:30. In specific embodiments, the aspect ratio of inter-finger spacing distance d to height H is greater than or equal to 1:50, and may range up to 1:70, or approximately 1:70. In such specific embodiments, inter-finger spacing distance d may be about 140 nm and height H is about 10 µm.

By way of further explanation, by forming rotor comb-fingers 208 and stator comb-fingers 210 in an SON layer, or the like, inter-finger spacing distance d may be made small, such as less than 500 nm. In such embodiments, the air-flow through the gap between rotor comb-fingers 208 and stator comb-fingers 210, and hence around membrane 206, may be reduced. Thus, when MEMS transducer 200 is implemented as a MEMS microphone, for example, the sensitivity may be increased by reducing the air-flow that may bypass membrane 206 through the gap between rotor comb-fingers 208 and stator comb-fingers 210.

Trench width tw gives the spacing between framework 204 and substrate 202. In various embodiments, trench width tw ranges from 100 nm to 10 µm. In particular embodiments, trench width tw ranges from 500 nm to 5 µm.

According to various embodiments, support fixture 214 and torsional supports 216 may provide a stress decoupling function for MEMS transducer 200. For example, substrate 202 may develop layer stress, such as during packaging. In such embodiments, coupling framework 204 to substrate 202 through support fixture 214 and torsional supports 216 reduces the layer stress transferred from substrate 202 to framework 204. A further embodiment with further reduced stress transfer is described hereinafter in reference to FIG. 6.

Various further details in reference to fabrication processing steps and materials for MEMS transducer 200 are described further hereinafter in reference to the flowchart diagram for the embodiments method of fabrication illustrated in FIG. 3 and the corresponding cross-sectional perspective views.

FIG. 3 illustrates a flowchart diagram of an embodiment method of fabrication 300 for an embodiment MEMS transducer, such as described hereinabove in reference to MEMS transducer 200 in FIGS. 2A and 2B. FIGS. 4A, 4B, 4C, 4D, 4E, and 4F illustrate cross-sectional perspective views of steps in method of fabrication 300. According to various embodiments, method of fabrication 300 includes steps 305-360. In such various embodiments, step 305 includes forming a silicon-on-nothing (SON) structure and an oxide liner. The intermediate structure of step 305 is illustrated in FIG. 4A, which includes cavity 230 and oxide liner 232 formed within substrate 202 as the SON structure, where the top layer of substrate 202 above cavity 230 is referred to as SON layer 201.

In various embodiments, substrate 202 is a semiconductor substrate. Substrate 202 may be doped for improved conductivity in some embodiments. In particular embodiments, substrate 202 is silicon. Particularly, substrate 202 is monocrystalline silicon. In alternative an embodiment, substrate 202 is germanium. In still another alternative embodiment, substrate 202 is carbon. In further alternative embodiments, substrate 202 is a compound semiconductor such as gallium arsenide, silicon carbide, silicon germanium, indium phosphide, or gallium nitride. In still further alternative embodiments, substrate 202 may be other semiconductive or conductive substrate materials as are known to those of skill in the art. In particular alternative embodiments, the substrate may include organic materials such as glass or ceramic. The substrate may be a wafer.

According to various embodiments where substrate 202 is monocrystalline silicon, the SON structure may be formed by a process including etching trenches in substrate 202 and reflowing the silicon. In such embodiments, trenches are etched in substrate 202 according to a pattern that matches the desired shape of cavity 230. For example, the trenches may be etched in substrate 202 in a rectangular pattern, a circular pattern, or an oval pattern. In order to etch the trenches in substrate 202, a reactive ion etch (RIE) process may be used. For an RIE process, an etch mask may be formed on the top surface of substrate 202 with the desired pattern of the trenches. For example, the etch mask may be a photoresist material, an oxide layer, e.g., silicon dioxide, or a nitride layer patterned as the etch mask.

In various embodiments, once the trenches are etched in substrate 202, an annealing process may be performed to reflow the silicon of substrate 202. For example, the annealing process may be performed in low oxygen environment, such as a hydrogen environment, at a high temperature. In specific embodiments, the annealing process may be performed above 1000° C. for about 10 minutes. During the annealing process, the silicon columns or pillars between the trenches will reflow, with the base of each trench expanding and the top of each trench collapsing. When the trenches are spaced close enough together, the expanding bases of the trenches will merge to form cavity 230 and the collapsing tops of the trenches will also merge to form SON layer 201. In such embodiments, SON layer 201 is monocrystalline silicon. In various embodiments, the spacing of the trenches formed in substrate 202 along with the pressure, temperature, timing, and gas composition during the annealing process may be adjusted to form different shapes for cavity 230 with different thicknesses and dimensions for SON layer 201, as will be readily appreciated by those having skill in the art.

In various embodiments, oxide liner 232 is also formed in cavity 230. In such embodiments, when substrate 202 is monocrystalline silicon, oxide liner 232 is silicon oxide, such as silicon dioxide. In order to form oxide liner 232, a small opening may be formed in SON layer 201. For example, SON layer 201 may have a corned removed or a small hole formed to expose cavity 230 to an oxidizing process, such as a thermal oxidation process.

According to various embodiments, similar processing steps may be implemented when substrate 202 is not monocrystalline silicon in order to form a substrate-on-nothing layer as similarly described hereinabove in reference to SON layer 201. In such embodiments, various modifications may be applicable due to the different material properties of the material used for substrate 202, as will be readily appreciated by those having skill in the art. Additional details in reference to SON devices may be found in U.S. Pat. No. 9,136,328, filed Oct. 9, 2012 and entitled "Silicon on Nothing Devices and Methods of Formation Thereof," which is incorporated herein by reference in its entirety.

Following step 305, step 310 includes etching trench 234 and trench 238 in SON layer 201 from the top surface to oxide liner 232. Trench 234 and trench 238 may be etched by applying a wet etch chemistry or a dry etch chemistry. In various embodiments, trench 234 and trench 238 are etched using an RIE process. In such embodiments, an etch mask is formed on the top surface of SON layer 201. The etch mask may be a nitride or oxide hard mask that is prepared by patterning using photolithographic techniques including depositing a photoresist, exposing the photoresist to the mask pattern, developing the photoresist, and etching the etch mask. Once the etch mask has been prepared in order to leave trench 234 and trench 238 exposed, the RIE process is performed in order to etch trench 234 and trench 238.

Trench 234 and trench 238 may be staggered in order to form both sets of interdigitated comb fingers in a comb drive, as described hereinabove in reference to rotor comb-fingers 208 and stator comb-fingers 210 in FIGS. 2A and 2B.

In other embodiments, the etch mask for the RIE process may be a photoresist. In alternative embodiments, trench 234 and trench 238 may be etched using wet chemical etchants with a photoresist mask. In various embodiments, trench 234 or trench 238 may be etched with large or very large aspect ratios.

According to various embodiments, step 315 follows step 310 and includes forming trench filler 236. The intermediate structure of step 315 is illustrated in FIG. 4B, which includes trench filler 236 formed within trench 234 and trench 238. Trench filler 236 may include an oxide, a nitride and/or an oxynitride. For example, trench filler 236 may be a silicon oxide, e.g., silicon dioxide, or a tetraethyl orthosilicate (TEOS) oxide. Alternatively, the trench filler 236 may be silicon nitride. Trench filler 236 may be deposited or grown. In some embodiments, trench filler 236 may be deposited by applying a chemical vapor deposition (CVD) process, a physical vapor deposition (PVD) process, an atomic layer deposition (ALD) process, or a wet or dry oxidation of the substrate. In particular embodiments, trench filler 236 may be deposited using chemical vapor deposition (CVD).

In various embodiments, step 320 includes planarizing the top surface of substrate 202. In such embodiments, planarizing may include a chemical mechanical polish (CMP). In some embodiments, step 320 may be omitted.

According to various embodiments, step 325 includes forming an etch stop layer. In such embodiments, the etch stop layer may include an oxide layer or a nitride layer. The etch stop layer may be deposited on the top surface of substrate 202. Following step 325, membrane layer 240 is formed on the top surface of substrate 202 in step 330. The intermediate structure of step 330 is illustrated in FIG. 4C, which includes membrane layer 240 covering the surface of substrate 202. In such embodiments, the etch stop layer of step 325 (not shown) may be beneath membrane layer 240. In various embodiments, membrane layer 240 may a conductive or non-conductive material.

In embodiments where membrane layer 240 is a conductive material, the conductive material may be a metallic material. The metallic material may comprise a pure metal, an alloy or a compound. In some embodiments, the metallic material may, for example, include one or more of the elements chosen from the group consisting of aluminum, copper, Ni and Si. Specific embodiments, include pure aluminum, aluminum alloy, aluminum compound, pure copper, copper alloy, copper compound, pure nickel, nickel alloy and nickel compound. In one specific embodiment, the conductive material is an aluminum alloy with silicon and copper. In other embodiments, the conductive material may include a conductive polymer. In still other embodiments, the conductive material includes a doped semiconductor such as doped silicon. The doped silicon may comprise doped polysilicon and/or doped monocrystalline silicon. The doped silicon may be in situ doped. In further embodiments, membrane layer is undoped polysilicon.

In further embodiments, membrane layer 240 is a non-conductive material such as an oxide, nitride, or oxynitride. Membrane layer 240 may be a layer stack including conductive and non-conductive materials. In one such embodiment, membrane layer 240 includes a stack of silicon nitride, polysilicon, and silicon nitride. In other embodiments, membrane layer 240 is a non-conductive polymer.

In various embodiments, membrane layer 240 may be deposited in different ways such as sputtering, PVD, CVD, or ALD. Membrane layer 240 may be deposited as a single step. When the conductive material comprises a metallic material, it is possible that the conductive material is deposited by a galvanic deposition. The conductive material may be directly deposited onto substrate 202 or the etch stop layer of step 325.

According to various embodiments, step 335 includes forming framework cavity 242, which is part of cavity 212 in MEMS transducer 200 as described hereinabove in reference to FIGS. 2A and 2B. The intermediate structure of step 335 is also illustrated in FIG. 4C, which includes framework cavity 242 formed beneath membrane layer 240. In various embodiments, the material, such as the monocrystalline silicon, of SON layer 201 within trench 238 is removed. For example, framework cavity 242 may be formed by etching. In such embodiments, a small hole or opening may be formed in membrane layer 240 and the etch stop layer of step 325 in order to expose the material beneath membrane layer 240, above cavity 230, and surrounded by trench 238 (which is filled with trench filler 236). The material is removed through the hole or opening by etching. For example, a wet chemical etch may be used. In particular embodiments when SON layer 201 is monocrystalline silicon, the wet chemical etch may be selective for silicon. In some embodiments, membrane layer 240 may be covered with a photoresist or other material in order to prevent etching of membrane layer 240. The etching to form framework cavity will progress to remove all of the material of SON layer 201 until oxide liner 232 and trench filler 236 are exposed. Oxide liner 232 and trench filler 236 may be resistant to the etching process and may thus act as etch stop layers.

In various embodiments, following step 335, step 340 includes patterning membrane layer 240 in order to form membrane 206 as described hereinabove in reference to FIGS. 2A and 2B. The intermediate structure of step 340 is illustrated in FIG. 4D, which includes membrane layer 240 patterned to cover framework cavity 242. In such embodiments, patterning membrane layer 240 may include applying a photoresist, developing the photoresist using a mask pattern, and etching membrane layer 240 in the exposed regions. Etching membrane layer 240 may include a wet chemistry etch or a dry chemistry etch. Membrane layer 240 may be etched everywhere on the surface of substrate 202 except above framework cavity 242. The etch stop layer of step 325 (not shown) may serve as an etch stop for the etching of membrane layer 240 and prevent substrate 202 (including the structures of rotor comb-fingers 208 and stator comb-fingers 210 formed by trench 234) and trench filler 236 from being etched.

In various embodiments, membrane layer 240 may be removed by applying a wet etch or a dry etch chemistry. For example, when membrane layer 240 includes a semiconductor, e.g., polysilicon or a doped semiconductor such as doped polysilicon, membrane layer 240 may be etched with KOH or acid solutions of $HNO_3$ and HF. In another embodiment a plasma process with chlorine or fluorine delivered by $SF_6$ or $Cl_2$ may be used to remove membrane layer 240.

According to various embodiments, step 345 includes forming a contact layer. The contact layer is a conductive layer for forming contact lines and contact pads. In such embodiments, forming the contact layer may include depositing the contact layer by sputtering, PVD, CVD, ALD, or galvanic deposition. In various embodiments, the contact layer may include one or more of the elements from the group consisting of aluminum, nickel, copper, gold, platinum, and titanium.

Step 350 includes patterning the contact layer to form contact pads 220a, 220b, and 220c and contact line 222. The intermediate structure of step 350 is illustrated in FIG. 4E, which includes contact pads 220a, 220b, and 220c and contact line 222 formed on substrate 202. The contact layer may be patterned by applying a photoresist, developing the photoresist using a mask pattern, and etching the contact layer in the exposed regions. In various embodiments, the contact layer may be removed by applying a wet etch or a dry etch chemistry. For example, the contact layer may be etched with KOH or acid solutions of $HNO_3$ and HF. In another embodiment a plasma process with chlorine or fluorine delivered by $SF_6$ or $Cl_2$ may be used to remove the contact layer material.

In alternative embodiments, contact pads 220a, 220b, and 220c may be formed using a silicide. The silicided contact pads may be formed by forming a metallic material on a conductive material. The metallic material may include one or more of the elements from the group consisting of Ni, Co, and Ti. The conductive material and the metallic material may be annealed to form the silicide. In some embodiments the contact pads 220a, 220b, and 220c are passivated.

Following step 350, step 355 includes etching substrate 202 from the back surface or backside. In such embodiments, substrate 202 is etched with a directional etch. For example, the substrate is etched with a Bosch process etch. This backside etch is applied such that the substrate is removed under cavity 230 formed in step 305. In specific embodiments, the backside etch is stopped by oxide liner 232. In such embodiments, the structures above cavity 230 in SON layer 201 (including interdigitated comb fingers of rotor comb-fingers 208 and stator comb-fingers 210 and framework 204) are protected by oxide liner 232 and trench filler 236 and remain standing and un-etched.

In alternative embodiments, the backside of substrate 202 is etched with a wet etch including, for example, KOH. In another embodiment the backside of substrate 202 is etched with a combination of dry etch and subsequent wet etching with a higher selectivity of substrate 202, such as a higher silicon selectivity, for example, versus the etch rate of oxide liner 232, for example. In some embodiments, step 355 may be omitted as further described hereinafter in reference to FIGS. 7A, 7B, and 7C.

According to various embodiments, step 360 includes removing oxide liner 232 and trench filler 236 using a release etch. In such embodiments, oxide liner 232 and trench filler 236 are removed with a wet etch or a dry etch. For example, oxide liner 232 and trench filler 236 are etched by applying an HF based solution or vapor. Following step 360, MEMS transducer 200 is released and membrane 206, with framework 204 and rotor comb-fingers 208, is free to move. The final structure of step 360 is illustrated in FIG. 4F, which is a duplication of FIG. 2A and includes framework 204, membrane 206, rotor comb-fingers 208, and stator comb-fingers 210. Further, following the release etch, framework 204 with membrane 206 may deflect to the at rest position with an offset compared to stator comb-fingers 210. In various embodiments, step 360 also includes forming cavity 212 beneath membrane 206, rotor comb-fingers 208, and stator comb-fingers 210 by joining framework cavity 242 with the cavity formed in substrate 202 during the backside etch of step 355.

According to various embodiments as illustrated hereinabove in reference to FIGS. 3, 4A, 4B, 4C, 4D, 4E, and 4F, rotor comb-fingers 208, stator comb-fingers 210, and framework 204 are formed of a same semiconductive or conductive layer, i.e., in SON layer 201, such as monocrystalline silicon in particular embodiments.

FIG. 5 illustrates a top view of a further embodiment MEMS transducer 250 including substrate 202, framework 204, membrane 206, rotor comb-fingers 208, stator comb-fingers 210, and stress layer 252. According to various embodiments, MEMS transducer 250 may be similar to MEMS transducer 200 as described hereinabove in reference to FIGS. 2A and 2B, with the addition of stress layer 252. Commonly numbered elements are described hereinabove in reference to MEMS transducer 200 and will not be described again in the interest of brevity.

In various embodiments, rotor comb-fingers 208 and stator comb-fingers 210 may be offset by offset H-Offset, as described hereinabove in reference to rotor comb-fingers 114 and stator comb-fingers 116 in FIG. 1B. In such embodiments, stress layer 252 may be included in order to produce offset H-Offset. By forming stress layer 252 across torsion trench 218, a stress may be produced on torsional supports 216 in order to produce an at-rest deflection of framework 204 and rotor comb-fingers 208, which produces offset H-Offset. Stress layer 252 may be formed and patterned at various steps during method of fabrication 300, such as before the release etch of step 360. Once the release etch of step 360 is performed, the layer stress of stress layer 252 may cause a force on torsional supports 216 in order to produce a deflection for offset H-Offset.

According to various embodiments, stress layer 252 may be deposited using any of the processing techniques described hereinabove in reference to step 315 or step 330 in FIG. 3. Stress layer 252 may include materials deposited with tensile stress or compressive stress, for example. In various embodiments, stress layer 252 is a high stress material. In a specific embodiment, stress layer 252 is silicon nitride. In another specific embodiment, stress layer 252 is silicon oxynitride. In other embodiments, stress layer 252 is a low stress material. In a specific embodiment, stress layer 252 is TEOS. In another specific embodiment, stress layer 252 is silicon having a compressive stress that may depend on the dopant, such as phosphorous, implantation, for example. In various embodiments, stress layer 252 may have various different shapes and dimension and may be arranged at different positions for different embodiment MEMS transducers.

FIG. 6 illustrates a top view of an additional embodiment MEMS transducer 251 including substrate 202, framework 204, membrane 206, rotor comb-fingers 208, stator comb-fingers 210, stress layer 252, and stress decoupling trench 254. According to various embodiments, MEMS transducer 251 may be similar to MEMS transducer 200 or MEMS transducer 251 as described hereinabove in reference to FIGS. 2A, 2B, and 5, with the addition of stress decoupling trench 254. Commonly numbered elements are described hereinabove in reference to MEMS transducer 200 and MEMS transducer 251 and will not be described again in the interest of brevity. In some embodiments, stress layer 252 may be omitted.

According to various embodiments, stress decoupling trench 254 may be formed in a same etch process as trench 205 and torsion trench 218 during step 310 in method of fabrication 300, as described hereinabove in reference to FIGS. 3, 4A, 4B, 4C, 4D, 4E, and 4F. In various embodiments, stress decoupling trench 254 decouples framework 204, membrane 206, and rotor comb-fingers 208 from the stress of substrate 202. For example, during packaging of a MEMS transducer, such as MEMS transducer 251, substrate 202 may undergo some stress. In such embodiments, by including stress decoupling trench 254, the stress of substrate 202 is not transferred to the deflectable membrane structure inside trench 205. In various embodiments, dimensions and configuration of stress decoupling trench 254 may be modified to have numerous embodiment configurations, such as including multiple connections to substrate 202 or a single smaller connection. For example, different connection structures between the central transducer region (including framework 204, membrane 206, and rotor comb-fingers 208 coupled to the surrounding support structure through torsional supports 216) and substrate 202 may be implemented, such as a by using cardanic-like gimbal supports.

FIGS. 7A, 7B, and 7C illustrate cross-sectional perspective views of an additional embodiment MEMS transducer 260 in an additional embodiment method of fabrication. Specifically, MEMS transducer 260a in FIG. 7A, MEMS transducer 260b in FIG. 7B, and MEMS transducer 260c in FIG. 7C illustrate MEMS transducer 260 in different steps of fabrication sequence. According to various embodiments, MEMS transducer 260 may be similar to MEMS transducer 200 as described hereinabove in reference to FIGS. 2A and 2B. Commonly numbered elements are described hereinabove in reference to MEMS transducer 200 and will not be described again in the interest of brevity. In particular embodiments, MEMS transducer 260 is formed using a similar method of fabrication as MEMS transducer 200 as described hereinabove in reference to FIGS. 3, 4A, 4B, 4C, 4D, 4E, and 4F. In such embodiments, method of fabrication 300 may be modified for MEMS transducer 260 as described herein below.

According to various embodiments, MEMS transducer 260a includes cavity 231, which may be formed as similarly described hereinabove in reference to cavity 230 in FIGS. 3 and 4A, but may extend further as shown in FIG. 7A. Thus, step 305 may be modified to form an extend cavity as cavity 231. Further, support pillars 262 may be formed inside cavity 231. Support pillars 262 may be small silicon pillars in various embodiments. Alternatively, support pillars 262 may be formed of another material. In some embodiments, cavity 230 is included as described hereinabove in reference to method of fabrication 300 in FIG. 3 and cavity 231 is added in addition to cavity 230 (not shown). In such embodiments, cavity 230 may define the height and structure of framework 204 by setting the bottom edge of cavity 242 while cavity 231 separately defines the bottom edge of inner substrate 203. In such embodiments, two steps to form an SON layer, or the like, as described hereinabove in reference to step 305 in FIG. 3 may be performed to form two SON layers, or the like.

In various embodiments, MEMS transducer 260 may be formed according to method of fabrication 300, without including the backside etch of step 355. In various such embodiments, MEMS transducer 260b includes outer trench 264 surrounding the entirety of the transducer structure. Outer trench 264 may be formed during step 310 as described hereinabove in reference to FIG. 3. In such embodiments, outer trench 264 may also be filled with trench filler 236 as described hereinabove in reference to step 315 in FIG. 3. In other embodiments, outer trench 264 may be formed at another point during method of fabrication 300. In various embodiments, outer trench 264, along with cavity 231, separates substrate 202 from inner substrate 203. Inner substrate 203 includes the entirety of the transducer structure (including framework 204, membrane 206, rotor comb-fingers 208, and stator comb-fingers 210). Thus, during the release etch of step 360 (FIG. 3), outer trench 264 may be released such that inner substrate 203 is isolated or detached from substrate 202. In such embodiments, support pillars 262 are the only elements connecting inner substrate 203 to substrate 202.

According to various embodiments, a lift-off step may be performed that removes inner substrate 203 from substrate 202. In such embodiments, substrate 202 may be a wafer, such as a bulk silicon wafer, and inner substrate 203, as MEMS transducer 260c illustrated in FIG. 7C, may be removed from the wafer by the lift-off step. In such embodiments, support pillars 262 may be broken during the lift-off step.

In various embodiments, the chip height HC of inner substrate 203, corresponding to MEMS transducer 260c, may be small. In particular embodiments, chip height HC is less than or equal to 500 µm. In some specific embodiments, chip height HC is less than or equal to 300 µm. In further specific embodiments, chip height HC is less than or equal to 200 µm. In still more specific embodiments, chip height HC is less than or equal to 100 µm. In some embodiments, it may be advantageous to produce embodiment MEMS transducers with small chip heights, such as by using embodiment lift-off steps for MEMS transducer 260, in order to reduce final package and product thickness. For example, in mobile computing devices, such as, e. g., mobile phones, tablet computers, or laptops, creating a thin computing device may be desirable. Further, in some embodiment, it may be advantageous to produce embodiment MEMS transducers without performing a backside etch step. For example, MEMS transducer 260 may be formed in an embodiment method of fabrication using a lift-off step without a backside etch to form cavity 212 beneath membrane 206.

FIG. 8 illustrates a flowchart diagram of a further embodiment method of fabrication 400 for an embodiment MEMS transducer. According to various embodiments, method of fabrication 400 includes steps 405, 410, and 415. In such embodiments, step 405 includes forming a transducer frame in a layer of monocrystalline silicon. Forming the transducer frame may include forming a support portion adjacent a cavity and forming a first set of comb-fingers extending from the support portion. In such embodiment the transducer frame may be referred to as part of a rotor and the first set of comb-fingers may be referred to as rotor comb-fingers.

Following step 405, step 410 includes forming a spring support from an anchor to the support portion. For example, the spring support may include a torsional spring structure. The spring support may be coupled to a same edge of the support portion as the first set of comb-fingers or a different edge. In such embodiments, the support portion may have two or more edges. In specific embodiments the support portion is rectangular with four edges.

According to various embodiments, step 410 includes forming a second set of comb-fingers in the layer of monocrystalline silicon. In such embodiments, the second set of comb-fingers is interdigitated with the first set of comb-fingers. In alternative embodiments, the layer of monocrystalline silicon may include alternative materials, such as germanium for example. In specific embodiments, the layer of monocrystalline silicon is an SON layer. According to various embodiments, method of fabrication 400 may be modified to include numerous additional processing steps or rearranged according to any of the embodiments described hereinabove in reference to the other figures.

According to an embodiment, a method of forming a MEMS transducer includes forming a transducer frame in a layer of monocrystalline silicon, where forming the transducer frame includes forming a support portion adjacent a cavity and forming a first set of comb-fingers extending from the support portion. The method of forming a MEMS transducer further includes forming a spring support from an anchor to the support portion and forming a second set of comb-fingers in the layer of monocrystalline silicon. The second set of comb-fingers is interdigitated with the first set of comb-fingers. Other embodiments include corresponding systems and apparatus, each configured to perform various embodiment methods.

In various embodiments, the first set of comb-fingers and the second set of comb-fingers are formed with an inter-finger spacing distance between each comb-finger of the first set of comb-fingers and each corresponding adjacent comb-finger of the second set of comb-fingers between 100 nm and 300 nm. In some embodiments, the first set of comb-fingers and the second set of comb-fingers are formed with a comb-finger aspect ratio equal to or exceeding 1:50, where the comb-finger aspect ratio is a ratio of an inter-finger spacing distance between each comb-finger of the first set of comb-fingers and each corresponding adjacent comb-finger of the second set of comb-fingers to a layer thickness of the first set of comb-fingers and the second set of comb-fingers.

In various embodiments, forming the transducer frame further includes forming a membrane layer on the support portion and overlying the cavity. In some embodiments, the method of forming a MEMS transducer further includes forming a stress layer mechanically coupled to the spring support and configured to deflect the transducer frame at rest. Forming the spring support may include patterning a torsional spring supports between the anchor and the support portion.

In various embodiments, the method of forming a MEMS transducer further includes forming the MEMS transducer with a chip thickness that is less than or equal to 300 μm. In some embodiments, the method of forming a MEMS transducer further includes forming a stress decoupling gap extending from the anchor and surrounding the transducer frame, the spring support, and the second set of comb-fingers, where the stress decoupling gap is configured to reduce a transfer of layer stress from a substrate of the MEMS transducer to the transducer frame, the spring support, and the second set of comb-fingers.

According to an embodiment, a method of forming a MEMS transducer includes forming a silicon-on-nothing structure in a monocrystalline silicon substrate, etching high aspect ratio trenches through the silicon-on-nothing structure, forming a membrane on the silicon-on-nothing structure, forming a cavity in the silicon-on-nothing structure adjacent the high aspect ratio trenches and beneath the membrane, and exposing the cavity by removing a backside portion of the monocrystalline silicon substrate. Other embodiments include corresponding systems and apparatus, each configured to perform various embodiment methods.

In various embodiments, etching high aspect ratio trenches includes etching trenches with an aspect ratio equal to or exceeding 1:50. In some embodiments, exposing the cavity by removing the backside portion of the monocrystalline silicon substrate includes performing a backside etch through the monocrystalline silicon substrate. In other embodiments, exposing the cavity by removing the backside portion of the monocrystalline silicon substrate includes etching a trench surrounding the silicon-on-nothing structure and performing a lift-off step to remove the silicon-on-nothing structure from the monocrystalline silicon substrate. In some such embodiments, after performing the lift-off step, the silicon-on-nothing structure has a layer thickness less than or equal to 300 μm.

In various embodiments, forming the membrane on the silicon-on-nothing structure includes forming a framework and forming the membrane on the framework, and forming the cavity in the silicon-on-nothing structure includes forming the cavity in the framework such that the framework surrounds the cavity. In some embodiments, the method of forming a MEMS transducer further includes forming a torsional spring in the silicon-on-nothing structure, where the torsional spring is coupled to and supports the framework. The method of forming a MEMS transducer may further include forming a stress layer mechanically coupled to the torsional spring. In other embodiments, the method of forming a MEMS transducer further includes forming a stress decoupling gap extending from an anchor coupled to the torsional spring and surrounding the silicon-on-nothing structure, where the stress decoupling gap is configured to reduce a transfer of layer stress from the monocrystalline silicon substrate to the silicon-on-nothing structure.

According to an embodiment, a method of forming a MEMS device includes etching a plurality of trenches in a semiconductor substrate, reflowing the plurality of trenches to form a substrate-on-nothing structure from top portions of the plurality of trenches and form an empty space in the semiconductor substrate from bottom portions of the plurality of trenches, forming an etch stop liner in the empty space, forming a plurality of comb-fingers in the substrate-on-nothing structure, forming a membrane on the substrate-on-nothing structure, forming a cavity in the substrate-on-nothing structure beneath the membrane, removing a backside portion of the semiconductor substrate from a bottom surface of the semiconductor substrate to the empty space, and releasing the membrane and a first portion of the plurality of comb-fingers to deflect. The cavity in the substrate-on-nothing structure extends from a top surface of the semiconductor substrate to the etch stop liner. Other embodiments include corresponding systems and apparatus, each configured to perform various embodiment methods.

In various embodiments, the plurality of comb-fingers are formed with a comb-finger aspect ratio equal to or exceeding 1:50, where the comb-finger aspect ratio is a ratio of an inter-finger spacing distance between adjacent comb-fingers of the plurality of comb-fingers to a layer thickness of the plurality of comb-fingers. In some embodiments, the method of forming a MEMS device further includes forming a support spring, where forming the membrane on the substrate-on-nothing structure includes forming a framework coupled to the support spring and forming the membrane on the framework, and forming the cavity in the substrate-on-nothing structure includes forming the cavity in the framework such that the framework surrounds the cavity. In some such embodiments, the method of forming a MEMS device further includes forming a stress layer mechanically coupled to the support spring. The method of forming a MEMS device may further include forming a stress decoupling gap extending from an anchor coupled to the support spring and surrounding the substrate-on-nothing structure, where the stress decoupling gap is configured to reduce a transfer of layer stress from the semiconductor substrate to the substrate-on-nothing structure.

In various embodiments, removing the backside portion of the semiconductor substrate from the bottom surface of the semiconductor substrate to the empty space includes performing a backside etch through the semiconductor substrate. In other embodiments, removing the backside portion of the semiconductor substrate from the bottom surface of the semiconductor substrate to the empty space includes etching a trench surrounding the substrate-on-nothing structure and performing a lift-off step to remove the substrate-on-nothing structure from the semiconductor substrate.

According to an embodiment, a MEMS transducer includes a transducer frame formed in a layer of monocrystalline silicon, where the transducer frame includes a support portion surrounding a cavity and a first set of comb-fingers extending from the support portion. The MEMS transducer further includes a spring support coupled from an anchor to the support portion and a second set of comb-fingers formed in the layer of monocrystalline silicon, where the second set of comb-fingers are interdigitated with the first set of comb-fingers. Other embodiments include corresponding systems and apparatus, each configured to perform various embodiment methods.

In various embodiments, an inter-finger spacing distance between each comb-finger of the first set of comb-fingers and each corresponding adjacent comb-finger of the second set of comb-fingers is between 100 nm and 300 nm. In some embodiments, a comb-finger aspect ratio is equal to or exceeding 1:50, where the comb-finger aspect ratio is a ratio of an inter-finger spacing distance between each comb-finger of the first set of comb-fingers and each corresponding adjacent comb-finger of the second set of comb-fingers to a layer thickness of the first set of comb-fingers and the second set of comb-fingers.

In various embodiments, the transducer frame further includes a membrane layer on the support portion and overlying the cavity. In some embodiments, the MEMS transducer further includes a stress layer mechanically coupled to the spring support and configured to deflect the transducer frame at rest. The spring support may include a torsional spring structure. In further embodiments, the MEMS transducer has a chip thickness that is less than or equal to 300 µm. In some additional embodiments, the MEMS transducer further includes a stress decoupling gap extending from the anchor and surrounding the transducer frame, the spring support, and the second set of comb-fingers, where the stress decoupling gap is configured to reduce a transfer of layer stress from a substrate of the MEMS transducer to the transducer frame, the spring support, and the second set of comb-fingers.

Advantages of some of the embodiments described herein may include a MEMS transducer with a large SNR from a low noise floor and a high sensitivity. For example, an embodiment MEMS acoustic transducer using embodiment comb-drives may have reduced acoustic noise compared to a perforated backplate and diaphragm structure. Such embodiment MEMS acoustic transducers may also have reduced ventilation paths through the corresponding comb-drive structure due to reduced inter-finger spacing distance as described herein. Other advantages may include embodiment MEMS transducers with small chip height for thin product packages.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectromechanical systems (MEMS) transducer, the method comprising:
    forming a transducer frame in a layer of monocrystalline silicon, wherein forming the transducer frame comprises:
        forming a support portion adjacent to a cavity,
        forming a membrane layer on the support portion and overlying the cavity, and
        forming a first set of comb-fingers extending from the support portion;
    forming a spring support from an anchor to the support portion, wherein forming the spring support comprises patterning a torsional spring support between the anchor and the support portion adjacent to a first side of the membrane layer opposite the first set of comb-fingers; and
    forming a second set of comb-fingers in the layer of monocrystalline silicon, the second set of comb-fingers being interdigitated with the first set of comb-fingers.

2. The method of forming a MEMS transducer of claim 1, wherein the first set of comb-fingers and the second set of comb-fingers are formed with an inter-finger spacing distance between each comb-finger of the first set of comb-fingers and each corresponding adjacent comb-finger of the second set of comb-fingers between 100 nm and 300 nm.

3. The method of forming a MEMS transducer of claim 1, wherein the first set of comb-fingers and the second set of comb-fingers are formed with a comb-finger aspect ratio equal to or exceeding 1:50, the comb-finger aspect ratio being a ratio of an inter-finger spacing distance between each comb-finger of the first set of comb-fingers and each corresponding adjacent comb-finger of the second set of comb-fingers to a layer thickness of the first set of comb-fingers and the second set of comb-fingers.

4. The method of forming a MEMS transducer of claim 1, further comprising forming a stress layer mechanically coupled to the spring support and configured to deflect the transducer frame at rest.

5. The method of forming a MEMS transducer of claim 1, further comprising forming the MEMS transducer with a chip thickness that is less than or equal to 300 µm.

6. The method of forming a MEMS transducer of claim 1, further comprising forming a stress decoupling gap extending from the anchor and surrounding the transducer frame, the spring support, and the second set of comb-fingers, wherein the stress decoupling gap is configured to reduce a transfer of layer stress from a substrate of the MEMS transducer to the transducer frame, the spring support, and the second set of comb-fingers.

7. A method of forming a microelectromechanical systems (MEMS) transducer, the method comprising:
    forming a silicon-on-nothing structure in a monocrystalline silicon substrate;
    etching high aspect ratio trenches through the silicon-on-nothing structure;
    forming a membrane on the silicon-on-nothing structure;
    forming a cavity in the silicon-on-nothing structure adjacent the high aspect ratio trenches and beneath the membrane; and
    exposing the cavity by removing a backside portion of the monocrystalline silicon substrate.

8. The method of forming a MEMS transducer of claim 7, wherein etching high aspect ratio trenches comprises etching trenches with an aspect ratio equal to or exceeding 1:50.

9. The method of forming a MEMS transducer of claim 7, wherein exposing the cavity by removing the backside portion of the monocrystalline silicon substrate comprises performing a backside etch through the monocrystalline silicon substrate.

10. The method of forming a MEMS transducer of claim 7, wherein exposing the cavity by removing the backside portion of the monocrystalline silicon substrate comprises:

etching a trench surrounding the silicon-on-nothing structure; and performing a lift-off step to remove the silicon-on-nothing structure from the monocrystalline silicon substrate.

11. The method of forming a MEMS transducer of claim 10, wherein, after performing the lift-off step, the silicon-on-nothing structure has a layer thickness less than or equal to 300 μm.

12. The method of forming a MEMS transducer of claim 7, wherein forming the membrane on the silicon-on-nothing structure comprises forming a framework and forming the membrane on the framework; and forming the cavity in the silicon-on-nothing structure comprises forming the cavity in the framework such that the framework surrounds the cavity.

13. The method of forming a MEMS transducer of claim 12, further comprising forming a torsional spring in the silicon-on-nothing structure, wherein the torsional spring is coupled to and supports the framework.

14. The method of forming a MEMS transducer of claim 13, further comprising forming a stress layer mechanically coupled to the torsional spring.

15. The method of forming a MEMS transducer of claim 13, further comprising forming a stress decoupling gap extending from an anchor coupled to the torsional spring and surrounding the silicon-on-nothing structure, wherein the stress decoupling gap is configured to reduce a transfer of layer stress from the monocrystalline silicon substrate to the silicon-on-nothing structure.

16. A method of forming a microelectromechanical systems (MEMS) device, the method comprising:

etching a plurality of trenches in a semiconductor substrate;

reflowing the plurality of trenches to:
form a substrate-on-nothing structure from top portions of the plurality of trenches, and
form an empty space in the semiconductor substrate from bottom portions of the plurality of trenches;

forming an etch stop liner in the empty space;

forming a plurality of comb-fingers in the substrate-on-nothing structure;

forming a membrane on the substrate-on-nothing structure;

forming a cavity in the substrate-on-nothing structure beneath the membrane, the cavity extending from a top surface of the semiconductor substrate to the etch stop liner;

removing a backside portion of the semiconductor substrate from a bottom surface of the semiconductor substrate to the empty space; and releasing the membrane and a first portion of the plurality of comb-fingers to deflect.

17. The method of forming a MEMS device of claim 16, wherein the plurality of comb-fingers are formed with a comb-finger aspect ratio equal to or exceeding 1:50, the comb-finger aspect ratio being a ratio of an inter-finger spacing distance between adjacent comb-fingers of the plurality of comb-fingers to a layer thickness of the plurality of comb-fingers.

18. The method of forming a MEMS device of claim 16, further comprising forming a support spring, wherein forming the membrane on the substrate-on-nothing structure comprises:
forming a framework coupled to the support spring, and
forming the membrane on the framework; and forming the cavity in the substrate-on-nothing structure comprises forming the cavity in the framework such that the framework surrounds the cavity.

19. The method of forming a MEMS device of claim 18, further comprising forming a stress layer mechanically coupled to the support spring.

20. The method of forming a MEMS device of claim 18, further comprising forming a stress decoupling gap extending from an anchor coupled to the support spring and surrounding the substrate-on-nothing structure, wherein the stress decoupling gap is configured to reduce a transfer of layer stress from the semiconductor substrate to the substrate-on-nothing structure.

21. The method of forming a MEMS device of claim 16, wherein removing the backside portion of the semiconductor substrate from the bottom surface of the semiconductor substrate to the empty space comprises performing a backside etch through the semiconductor substrate.

22. The method of forming a MEMS device of claim 16, wherein removing the backside portion of the semiconductor substrate from the bottom surface of the semiconductor substrate to the empty space comprises:

etching a trench surrounding the substrate-on-nothing structure; and performing a lift-off step to remove the substrate-on-nothing structure from the semiconductor substrate.

23. A microelectromechanical systems (MEMS) transducer comprising:

a transducer frame formed in a layer of monocrystalline silicon, the transducer frame comprising:
a support portion adjacent to a cavity,
a membrane layer on the support portion and overlying the cavity, and
a first set of comb-fingers extending from the support portion;

a spring support coupled from an anchor to the support portion, wherein the spring support comprises a torsional spring support connected between the anchor and the support portion adjacent to a first side of the membrane layer opposite the first set of comb-fingers; and a second set of comb-fingers formed in the layer of monocrystalline silicon and being interdigitated with the first set of comb-fingers.

24. The MEMS transducer of claim 23, wherein an inter-finger spacing distance between each comb-finger of the first set of comb-fingers and each corresponding adjacent comb-finger of the second set of comb-fingers is between 100 nm and 300nm.

25. The MEMS transducer of claim 23, wherein a comb-finger aspect ratio is equal to or exceeding 1:50, the comb-finger aspect ratio being a ratio of an inter-finger spacing distance between each comb-finger of the first set of comb-fingers and each corresponding adjacent comb-finger of the second set of comb-fingers to a layer thickness of the first set of comb-fingers and the second set of comb-fingers.

26. The MEMS transducer of claim 23, further comprising a stress layer mechanically coupled to the spring support and configured to deflect the transducer frame at rest.

27. The MEMS transducer of claim 23, wherein the MEMS transducer has a chip thickness that is less than or equal to 300 μm.

28. The MEMS transducer of claim 23, further comprising a stress decoupling gap extending from the anchor and surrounding the transducer frame, the spring support, and the second set of comb-fingers, wherein the stress decoupling gap is configured to reduce a transfer of layer stress from a substrate of the MEMS transducer to the transducer frame, the spring support, and the second set of comb-fingers.

29. The method of forming a MEMS transducer of claim 1, wherein the method does not include forming a stress layer mechanically coupled to the spring support, and does not include forming a stress decoupling gap.

* * * * *